US010895753B2

(12) United States Patent
Chern et al.

(10) Patent No.: US 10,895,753 B2
(45) Date of Patent: Jan. 19, 2021

(54) STRUCTURED LIGHT GENERATION DEVICE AND DIFFRACTIVE OPTICAL ELEMENT THEREOF

(71) Applicant: AHEAD OPTOELECTRONICS, INC., New Taipei (TW)

(72) Inventors: Jyh-Long Chern, New Taipei (TW); Chih-Ming Yen, New Taipei (TW)

(73) Assignee: AHEAD OPTOELECTRONICS, INC., New Taipei (TW)

( * ) Notice: Subject to any disclaimer, the term of this patent is extended or adjusted under 35 U.S.C. 154(b) by 172 days.

(21) Appl. No.: 16/161,258

(22) Filed: Oct. 16, 2018

(65) Prior Publication Data

US 2019/0041659 A1 Feb. 7, 2019

Related U.S. Application Data

(63) Continuation-in-part of application No. 14/706,401, filed on May 7, 2015, now abandoned.

(30) Foreign Application Priority Data

Nov. 14, 2014 (TW) .............................. 103139607 A
Nov. 14, 2014 (TW) .............................. 103220315 A (51) Int. Cl.
*G02B 27/42* (2006.01)
*G02B 27/09* (2006.01)
(Continued)

(52) U.S. Cl.
CPC .......... *G02B 27/425* (2013.01); *G01S 7/4814* (2013.01); *G02B 5/1814* (2013.01); *G02B 5/1842* (2013.01); *G02B 27/0944* (2013.01);
*H01S 3/0071* (2013.01); *H01S 5/005* (2013.01); *G02B 2005/1804* (2013.01);
(Continued)

(58) Field of Classification Search
CPC ................ G02B 27/425; G02B 5/1842; G02B 27/0944; G02B 5/1814; G02B 2005/1804; G01S 7/4814; H01S 5/005; H01S 3/0071; H01S 5/02296; H01S 5/423; H01S 5/02292
See application file for complete search history.

(56) References Cited

U.S. PATENT DOCUMENTS 7,763,841 B1 7/2010 McEldowney
2007/0064755 A1 3/2007 Tanaka et al.
(Continued)

OTHER PUBLICATIONS

Spagnolo (Diffractive optical element-based profilometer for surface inspection, Opt. Eng. 40 (4) pp. 44-52 {Jan. 2001}).

*Primary Examiner* — Kimberly N. Kakalec
(74) *Attorney, Agent, or Firm* — WPAT, PC (57) ABSTRACT

A structured light generation device includes a laser light source module and a diffractive optical element. After a non-collimated light beam from the laser light source module is received by a diffraction layer of the diffractive optical element, the non-collimated light beam is modulated as an optical information-bearing light. Since no collimator is between the laser light source module and the diffractive optical element, the spacing distance between the laser light source module and the diffractive optical element is shortened. Consequently, the overall structured light generation device is slim.

38 Claims, 9 Drawing Sheets

(51) Int. Cl.
*H01S 3/00* (2006.01)
*G02B 5/18* (2006.01)
*G01S 7/481* (2006.01)
*H01S 5/00* (2006.01)
*H01S 5/022* (2006.01)
*H01S 5/42* (2006.01)

(52) U.S. Cl.
CPC ....... *H01S 5/02292* (2013.01); *H01S 5/02296* (2013.01); *H01S 5/423* (2013.01)

(56) References Cited

U.S. PATENT DOCUMENTS

| | | |
|---|---|---|
| 2009/0109534 A1 | 4/2009 | Gurevich et al. |
| 2010/0060904 A1 | 3/2010 | Keightley et al. |
| 2012/0038986 A1* | 2/2012 | Pesach .................... G01S 17/74 359/572 |
| 2012/0262553 A1 | 10/2012 | Chen et al. |
| 2013/0038881 A1 | 2/2013 | Pesach et al. |
| 2013/0170041 A1 | 7/2013 | Okada et al. |
| 2014/0111616 A1 | 4/2014 | Blayvas |
| 2016/0127713 A1* | 5/2016 | Hazeghi ............. G02B 27/0075 348/49 |
| 2016/0178358 A1* | 6/2016 | Miyasaka .............. G02B 27/30 356/610 |

\* cited by examiner

STRUCTURED LIGHT GENERATION DEVICE AND DIFFRACTIVE OPTICAL ELEMENT THEREOF

CROSS-REFERENCE TO RELATED APPLICATION

This application is continuation-in-part application of U.S. patent application Ser. No. 14/706,401, field May 7, 2015 and hereby incorporates the content of this application by reference.

FIELD OF THE INVENTION

The present invention relates to an optical device, and more particularly to a structured light generation device.

BACKGROUND OF THE INVENTION

In current days mobile devices such as smart phones are essential electronic devices for most people in the modern societies. The use of mobile phone is no more limited to voice communication between two persons. In nowadays, smart phone generally contains large panel which is used as the media of input and output simultaneously, i.e., touch panel and display are combined together. As the trends of designing touch panels are toward the large-size touch panels, mobile devices have sufficient spaces to accommodate requisite components. However, in addition to the large-size touch panels, the trends of designing mobile devices are also toward light weightiness and slimness. Consequently, if some components of the mobile device have to be installed in the mobile device in a specified fashion because of the required functions or other factors, the thicknesses and the sizes of these components are directly related to the thickness of the mobile device. For example, in most commercially-available smart phones, the thickness of the lens module is larger than the thickness of the smart phone. Consequently, after the lens module is accommodated within the smart phone, the position of the lens module is usually protruded over the case of the smart phone. Under this circumstance, the smart phone is not aesthetically pleasing.

Historically, the introduction of camera/lens module to mobile phone was not essential in the beginning. Since then, in less than 10-15 years, camera has been a standard equipment in mobile phone. Furthermore, multiple camera modules are even equipped in one mobile phone to enhance the imaging quality, such as depth of field, different zooming effects, wide-angle viewing and even stereo vision. To proceed more different capabilities of sensing and imaging, additional components of light emitters and sensors are required together with existing camera or even new-functional camera. Examples include LED flash light, ambient light source and sensor, diffusers for time of flight (TOF) and structured light module. Among the examples, the structured light module is mainly used to project a special light pattern in space for object recognition, e.g., facial recognition, and/or 3D information extraction, e.g., distance, range, and surface identifications.

Figure 1:
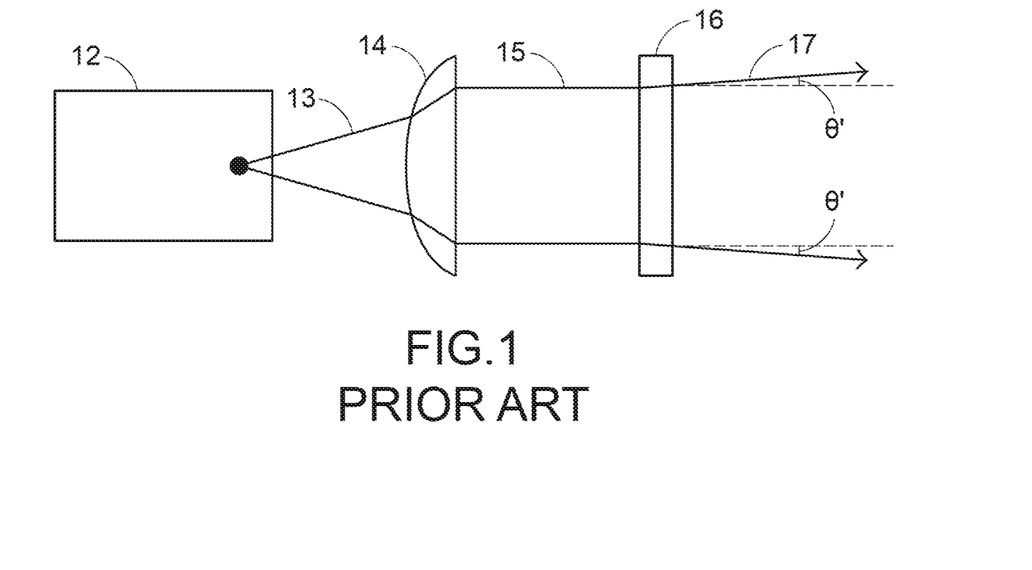
FIG. 1 is a schematic side view illustrating a conventional light generation device.

As mentioned above, the smart phone is equipped with the lens module. In addition, the trend of designing the smart phone is toward the integration of a component having a projecting function and a 3D information acquiring function, in which structured light module plays a critical role. FIG. 1 is a schematic side view illustrating a conventional light generation device, which is capable to produce a structured light. As shown in FIG. 1, the light generation device 1 comprises a light source module 12, a collimator 14 and a diffractive optical element (DOE) 16. For example, the light source module 12 is a laser light source module for generating a divergent beam 13. After the divergent beam 13 is received by a collimator 14, the divergent beam 13 is collimated as a collimated light beam 15 by the collimator 14. After the collimated light beam 15 is received by the diffractive optical element 16, the collimated light beam 15 is diffracted by the diffractive optical element 16. Consequently, a diffracted light beam 17 with a specified beam diffusion angle θ' and/or a specified structured light pattern is outputted from the diffractive optical element 16. Typical value of θ' is 30 to 45 degrees which means the projected range (FOV) is 60-90 degrees and typically it is projected with a rectangular form.

For most DOEs that used in structured light module, for reducing the occurrence of the diffraction error, the light beam to be received by the diffractive optical element (DOE) 16 has to be collimated as the collimated light beam 15. In other words, it is necessary to install the collimator 14 in the light generation device 1 to collimate the divergent beam 13 as the collimated light beam 15. For achieving good collimating efficacy, the collimator 14 needs to have a larger effective focal length, a smaller numerical aperture (NA) or a larger F/# (f-number). Under this circumstance, the overall length (OAL) of the light generation device 1 or the total track length (TTL) cannot be effectively reduced. Consequently, it is difficult to reduce the weightiness and the thickness of the mobile device. In such a circumstance, it is micro-lens array (MLA) to be used to replace the collimating lens as a solution such that the OAL as well as TTL can be reduced. However, the design and the fabrication of MLA is complicated, and the yield is low which is also caused by the alignment issue in assembly.

Therefore, it is important to introduce a novel architecture to reduce the weightiness and the thickness of the mobile device. For example, a new structure of the light generation device and a new structure of the diffractive optical element are provided. If the smaller diffraction error and the higher diffraction efficiency are obtained when the divergent beam (i.e., the non-collimated light beam) is received by the diffractive optical element, the possibility of producing a slim-type light generation device is increased.

SUMMARY OF THE INVENTION

For overcoming the drawbacks of the conventional technologies, the present invention provides a structured light generation device. A diffractive optical element of the structured light generation device receives a non-collimated light beam. Since the structured light generation device is not equipped with a collimator, the reduction percentage of the overall thickness of the structured light generation device is more than 20%. Since the material cost and the assembling cost of the overall structured light generation device are both reduced, the structured light generation device is suitably applied to a slim-type mobile device or a wearable device.

In accordance with an aspect of the present invention, there is provided a structured light generation device. The structured light generation device includes a laser light source module and a diffractive optical element. The laser light source module includes a light source. The light source emits a non-collimated light beam. The diffractive optical element includes a diffraction layer. After the non-collimated light beam from the laser light source module is received by the diffraction layer, the non-collimated light beam is modulated as an optical information-bearing light. The structured light generation device satisfies at least one of mathematical relationships (1) and (2):

$$W_d \geq \frac{\varphi}{2 \cdot \tan\theta}, \quad (1)$$

$$1 \text{ mm} < W_d < 7 \text{ mm} \quad (2)$$

wherein $\theta$ is a half angle of beam diffusion of the non-collimated light beam, $\varphi$ is a beam diameter of the non-collimated light beam when projected to the diffraction layer, and $W_d$ is a working distance between the light source and the diffraction layer.

In an embodiment, the optical information-bearing light is a coded structured light.

In an embodiment, the structured light generation device further includes a casing. The laser light source module and the diffractive optical element are accommodated within the casing. The optical information-bearing light is outputted from the structured light generation device through at least one light output zone of the casing.

In an embodiment, the diffractive optical element further includes a light-transmissible substrate. The diffraction layer is disposed on a first surface of the light-transmissible substrate.

In an embodiment, the diffraction layer comprises plural microstructures.

In an embodiment, the first surface and a second surface of the light-transmissible substrate are concentric surfaces. The first surface of the light-transmissible substrate is arranged between the laser light source module and the second surface of the light-transmissible substrate, or the second surface of the light-transmissible substrate is arranged between the laser light source module and the first surface of the light-transmissible substrate.

In an embodiment, the first surface of the light-transmissible substrate is a flat surface or a curvy surface.

In an embodiment, the diffraction layer is distributed over a part or an entire of the first surface of the light-transmissible substrate.

In an embodiment, the diffraction layer is located at an outer side of the first surface of the light-transmissible substrate and exposed outside the first surface of the light-transmissible substrate, or the diffraction layer is located at an inner side of the first surface of the light-transmissible substrate.

In an embodiment, the first surface of the light-transmissible substrate faces the laser light source module or faces an external side of the structured light generation device.

In an embodiment, the diffractive optical element further includes a beam-expandable functional structure. The beam-expandable functional structure is formed on or disposed on a second surface of the light-transmissible substrate. The non-collimated light beam is transmitted through the beam-expandable functional structure.

In an embodiment, the beam-expandable functional structure includes a concave lens structure with a geometric optical surface. The concave lens structure is produced by a semiconductor production process or a precise machining process.

In an embodiment, the first surface of the light-transmissible substrate is arranged between the laser light source module and the second surface of the light-transmissible substrate, or the second surface of the light-transmissible substrate is arranged between the laser light source module and the first surface of the light-transmissible substrate.

In an embodiment, the diffractive optical element further includes an additional diffraction layer. The additional diffraction layer is disposed on a second surface of the light-transmissible substrate. The second surface of the light-transmissible substrate is arranged between the laser light source module and the first surface of the light-transmissible substrate. After the non-collimated light beam from the light source is transmitted through the additional diffraction layer, the non-collimated light beam is subjected to a beam-expanding action. The beam-expanded non-collimated light beam is modulated as the optical information-bearing light by the diffraction layer on the first surface of the light-transmissible substrate.

In an embodiment, a thickness of the light-transmissible substrate is smaller than 1 mm.

In an embodiment, there is a spacing distance between the laser light source module and the light-transmissible substrate, and the spacing distance is in a range between 0 mm and 4 mm.

In an embodiment, a numerical aperture (NA) of the diffractive optical element is in a range between 0.1 and 0.64.

In an embodiment, a non-air medium is filled between the light source and the diffractive optical element, and the non-collimated light beam is transmitted through the non-air medium.

In an embodiment, the non-air medium is made of a silicone resin, an epoxy resin or a polymer compound.

In an embodiment, a numerical aperture (NA) of the diffractive optical element is in a range between 0.2 and 0.96.

In an embodiment, a thickness of the diffraction layer is smaller than 0.1 mm.

In an embodiment, the laser light source module outputs a dot-like light pattern, a stripe-like light pattern, a multi-stripe light pattern, a randomly-distributed dot array light pattern or a regularly-distributed dot array light pattern.

In an embodiment, the laser light source module further includes an additional light source, and the diffractive optical element includes a first modulation unit corresponding to the light source and a second modulation unit corresponding to the additional light source. After the non-collimated light beam from the light source is transmitted through the first modulation unit, the optical information-bearing light is generated. After an additional non-collimated light beam from the additional light source is transmitted through the second modulation unit, an additional optical information-bearing light is generated.

In an embodiment, the non-collimated light beam from the light source and the additional non-collimated light beam from the additional light source are outputted according to different time sequences, or the non-collimated light beam from the light source and the additional non-collimated light beam from the additional light source are outputted according to the same time sequence.

In accordance with another aspect of the present invention, there is provided a diffractive optical element. The diffractive optical element includes a light-transmissible substrate and a diffraction layer. The diffraction layer is disposed on the light-transmissible substrate. After a non-collimated light beam from a light source is received by the diffraction layer, the non-collimated light beam is modulated as an optical information-bearing light. The diffractive optical element satisfies at least one of mathematical relationships (1) and (2):

$$W_d \geq \frac{\varphi}{2 \cdot \tan\theta}, \quad (1)$$

$$1 \text{ mm} < W_d < 7 \text{ mm} \quad (2)$$

wherein θ is a half angle of beam diffusion of the non-collimated light beam, φ is a beam diameter of the non-collimated light beam when projected to the diffraction layer, and $W_d$ is a working distance between the light source and the diffraction layer.

In an embodiment, the diffraction layer is disposed on a first surface of the light-transmissible substrate.

In an embodiment, the diffraction layer includes plural microstructures.

In an embodiment, the first surface and a second surface of the light-transmissible substrate are concentric surfaces. The first surface of the light-transmissible substrate is arranged between the light source and the second surface of the light-transmissible substrate, or the second surface of the light-transmissible substrate is arranged between the light source and the first surface of the light-transmissible substrate.

In an embodiment, the first surface of the light-transmissible substrate is a flat surface or a curvy surface.

In an embodiment, the diffraction layer is distributed over a part or an entire of the first surface of the light-transmissible substrate.

In an embodiment, the diffraction layer is located at an outer side of the first surface of the light-transmissible substrate and exposed outside the first surface of the light-transmissible substrate, or the diffraction layer is located at an inner side of the first surface of the light-transmissible substrate.

In an embodiment, the diffractive optical element further includes a beam-expandable functional structure. The beam-expandable functional structure is formed on or disposed on a second surface of the light-transmissible substrate.

In an embodiment, the beam-expandable functional structure includes a concave lens structure, and the concave lens structure is distributed over a part or an entire of the second surface of the light-transmissible substrate.

In an embodiment, the diffractive optical element further includes an additional diffraction layer. The additional diffraction layer is disposed on a second surface of the light-transmissible substrate. The second surface of the light-transmissible substrate is arranged between the light source and the first surface of the light-transmissible substrate. After the non-collimated light beam from the light source is transmitted through the additional diffraction layer, the non-collimated light beam is subjected to a beam-expanding action. The beam-expanded non-collimated light beam is modulated as the optical information-bearing light by the diffraction layer on the first surface of the light-transmissible substrate.

In an embodiment, a thickness of the light-transmissible substrate is smaller than 1 mm.

In an embodiment, a thickness of the diffraction layer is smaller than 0.1 mm.

In an embodiment, a numerical aperture (NA) of the diffractive optical element is in a range between 0.1 and 0.64.

In an embodiment, a non-air medium is filled between the light source and the diffractive optical element, and the non-collimated light beam is transmitted through the non-air medium.

In an embodiment, the non-air medium is made of a silicone resin, an epoxy resin or a polymer compound.

In an embodiment, a numerical aperture (NA) of the diffractive optical element is in a range between 0.2 and 0.96.

In accordance with a further aspect of the present invention, there is provided a structured light generation device. The structured light generation device includes a laser light source module and a diffractive optical element. The laser light source module includes a light source. The light source emits a non-collimated light beam. The diffractive optical element includes a diffraction layer. After the non-collimated light beam from the laser light source module is received by the diffraction layer, the non-collimated light beam is modulated as an optical information-bearing light. An optical axis of the light source and the diffractive optical element is non-linear.

In an embodiment, the structured light generation device further includes a reflective mirror. After the non-collimated light beam from the laser light source module is projected to the reflective mirror, the non-collimated light beam is reflected to the diffractive optical element by the reflective mirror.

In an embodiment, there is a first distance between the light source and the reflective mirror along the optical axis, and there is a second distance between the reflective mirror and the diffractive optical element along the optical axis. A total distance of the first distance and the second distance is in a range between 0 mm and 7 mm.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention provides a structured light generation device. The structured light generation device is suitably applied to a mobile device such as a smart phone. In case that the laser light source module of the conventional light generation device 1 has a TO-CAN package structure, the size is 6×6×7 mm (length×width×thickness). In accordance with a feature of the present invention, the structured light generation device is not equipped with the optical element for collimating the light beam. Consequently, the size is reduced to 4×6×4 mm or less. Since the thickness of the structured light generation device of the present invention is reduced to 4 mm or less, the thickness reduction of the present structured light generation device is larger than 20% (i.e., 7 mm−4 mm/7 mm=42.85%) when compared with the conventional light generation device. In case that the package structure of the present structured light generation device uses a surface mount device (SMD) laser light source module, the thickness of the structured light generation device can be reduced to 2 mm. When compared with the conventional light generation device, the thickness reduction of the present structured light generation device is larger than 50% (i.e., 7 mm−2 mm/7 mm=71.42%). Consequently, the structured light generation device is suitably applied to the handheld device. Moreover, the laser chip of the laser light source module can be directly printed on a printed circuit board (PCB) and fabricated by the conventional mounting process.

As known, the laser beam emitted by the general laser light source module is a non-collimated light beam. Conventionally, a collimator is used to collimate the non-collimated light beam into a parallel light beam. Then, the parallel light beam is introduced into another optical element (such as a diffractive optical element), and thus a structured light is generated. Typically, the beam divergence angle (full angle) from laser source can be ranged from 10, 20, and 40 or even 60 degrees, depending the characteristics of light emission and the beam divergence angle may be not uniform. Consequently, the collimator can be spherical, aspherical and even bi-conic to correct the wavefront for the DOE efficiently. In this context, the term "non-collimated light beam" indicates the laser beam emitted by the general laser light source module. Moreover, before the non-collimated light beam is introduced into the diffractive optical element of the present invention, the non-collimated light beam is not subjected to any collimating process. Consequently, the non-collimated light beam has a beam divergence that is not equal to zero degree.

Preferably but not exclusively, the laser light source module for emitting the non-collimated light beam includes an edge emitting laser light source module, a vertical cavity surface emitting laser (VCSEL) light source module or any other appropriate laser light source module. The size of emitter can be ranged from a few to a few hundred μm (1 μm=1 mm/1000) for a single point-like source to a few mm for a VCSEL array. In case of edge emitting laser source, the source size is generally a stripe with a scale of a few μm×a few hundred μm (height×width).

Figure 2A:
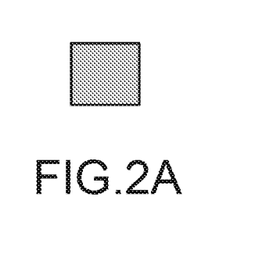
FIG. 2A schematically illustrates a dot-like light pattern outputted from a laser light source module.
Figure 2B:
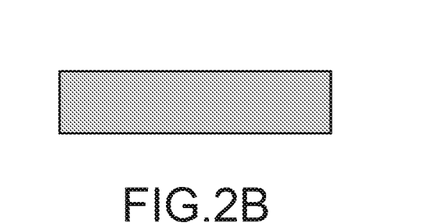
FIG. 2B schematically illustrates a stripe-like light pattern outputted from the laser light source module.
Figure 2C:
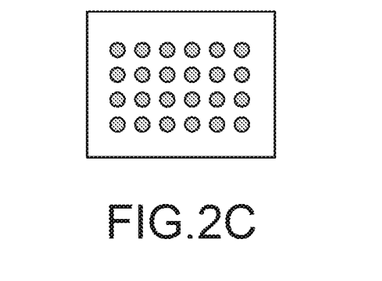
FIG. 2C schematically illustrates a regularly-distributed dot array light pattern outputted from the laser light source module.
Figure 2D:
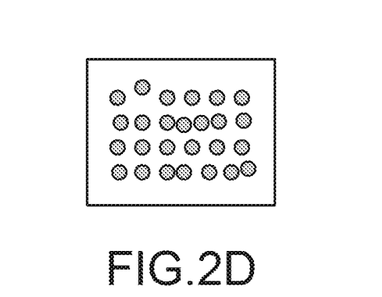
FIG. 2D schematically illustrates a randomly-distributed dot array light pattern outputted from the laser light source module.

Please refer to FIGS. 2A, 2B, 2C and 2D. FIG. 2A schematically illustrates a dot-like light pattern outputted from a laser light source module. FIG. 2B schematically illustrates a stripe-like light pattern outputted from the laser light source module. FIG. 2C schematically illustrates a regularly-distributed dot array light pattern outputted from the laser light source module. FIG. 2D schematically illustrates a randomly-distributed dot array light pattern outputted from the laser light source module. It is noted that the light patterns outputted from the laser light source module are not restricted to the light patterns of FIGS. 2A, 2B, 2C and 2D. For example, in another embodiment, the laser light source module outputs a multi-stripe light pattern.

In case that the type of the laser light source module is different, the type of the non-collimated light beam from the laser light source module is different. Preferably, the non-collimated light beam is a Gaussian beam. In case that the laser light source module is a Fabry-Perot type laser light source module, the outputted non-collimated light beam is an elliptic Gaussian beam. In case laser light source module is a vertical cavity surface emitting laser light source array (VCSEL array), the outputted non-collimated light beam is a TEM01 mode beam, a TEM10 mode beam or a higher-order TEM mode donut beam.

In case the types of the laser light source modules are different, the non-collimated light beams from the laser light source modules have different wavefronts and are obviously distinguished. In an embodiment, a diffraction layer of the diffractive optical element is designed according to the wavefront of the non-collimated light beam. Regardless of the type of the diffraction layer of the diffractive optical element, the thickness is smaller than 0.1 mm.

Figure 3:
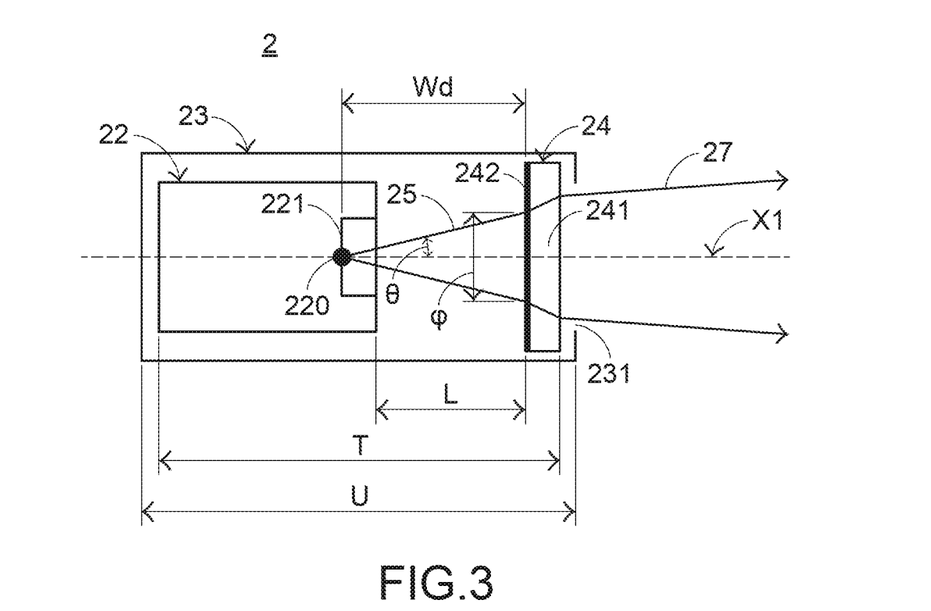
FIG. 3 is a schematic side view illustrating the architecture of a structured light generation device according to a first embodiment of the present invention.

FIG. 3 is a schematic side view illustrating the architecture of a structured light generation device according to a first embodiment of the present invention. The structured light generation device 2 comprises a laser light source module 22 and a diffractive optical element 24. The structured light generation device 2 may further comprise a casing 23. The laser light source module 22 and the diffractive optical element 24 are accommodated within the casing 23. In this embodiment, the laser light source module 22 comprises a light source 220 for outputting a non-collimated light beam 25. Preferably but not exclusively, the light source 220 is a laser chip. The non-collimated light beam 25 is outputted from a window 221 of the laser light source module 22. In an embodiment, the window 221 is an opening of the laser light source module 22. Optionally, an additional component (not shown) without the collimating function is located at the opening. For example, the additional component is a dustproof transparent protective sheet or glue. In some other embodiments, the laser light source module 22 provides a lighting surface or a vertical cavity surface emitting laser light source array (VCSEL array) for emitting plural non-collimated light beams 25.

The diffractive optical element 24 is located in front of the laser light source module 22. The non-collimated light beam 25 is directed to the diffractive optical element 24. In accordance with the present invention, no additional optical element or structure with the collimating function is included in the laser light source module 22 or interposed between the laser light source module 22 and the diffractive optical element 24. Moreover, there is a spacing distance L between the diffractive optical element 24 and the laser light source module 22. The spacing distance L is in the range between 0 mm and 4 mm. If the heat dissipation efficacy is not impaired, the diffractive optical element 24 may be completely attached on the laser light source module 22. Alternatively, the diffractive optical element 24 and the laser light source module 22 are separated from each other by a specified distance. If the diffractive optical element 24 of the present invention is completely attached on the laser light source module 22, the total length T of the diffractive optical element 24 and the laser light source module 22 (i.e., the overall length along the optical axis X1) can be largely reduced. In case that the laser light source module 22 has a TO-CAN package structure, the thickness U of the casing 23 is reduced to 4 mm or less. In case that the laser light source module 22 has a surface mount device (SMD) package structure, the thickness U of the casing 23 is reduced to 2 mm or less.

The diffractive optical element 24 comprises a light-transmissible substrate 241 and a diffraction layer 242. The diffraction layer 242 is disposed on the light-transmissible substrate 241 or disposed within the light-transmissible substrate 241. In an embodiment, the light-transmissible substrate 241 is made of a light-transmissible material. The diffraction layer 242 comprises plural microstructures that are formed on at least one surface of the light-transmissible substrate 241 and have diffractive textures or patterns. After the non-collimated light beam 25 is directed to the diffractive optical element 24 and diffracted by the diffractive optical element 24, an optical information-bearing light 27 with two dimensions or more than two dimensions is generated. The optical information-bearing light 27 is outputted to the outside of the structured light generation device 2 through a light output zone 231 of the casing 23 and projected to any appropriate light-receiving surface or space in order to perform various operations (e.g., a 3D information acquiring operation or an object identifying operation).

Preferably but not exclusively, the optical information-bearing light is a coded structured light. Moreover, the optical information-bearing light has a structured pattern with plural regular dots, a structured pattern with plural random dots, or a structured pattern with plural stripes. Moreover, since the optical information-bearing light 27 is modulated by the diffractive optical element 24, the brightness of the optical information can be uniform or have a gray level change according to the practical requirements. That is, there are no unexpected light spots beyond the designing condition. In addition to the optical information with the higher brightness, the optical information-bearing light 27 may also contain the background light with the lower brightness. In case that the optical information-bearing light 27 contains the background light, the brightness is uniform or slowly changed.

For determining the minimum volume of the structured light generation device 2, the structured light generation device 2 satisfies at least one of the mathematical relationships (1) and (2):

$$W_d \geq \frac{\varphi}{2 \cdot \tan\theta}, \tag{1}$$

$$1 \text{ mm} < W_d < 7 \text{ mm} \tag{2}$$

wherein $\theta$ is a half angle of beam diffusion of the non-collimated light beam 25, $\varphi$ is a beam diameter of the non-collimated light beam 25 when projected to the diffraction layer 242, and $W_d$ is a working distance between the light source 220 and the diffraction layer 242.

In an embodiment, the half angle of beam diffusion ($\theta$) of the non-collimated light beam 25 is 20 degree, and the beam diameter $\varphi$ of the non-collimated light beam 25 when projected to the diffraction layer 242 is at least 1 mm. That is, if the optical information-bearing light 27 is generated after the non-collimated light beam 25 is transmitted through the diffraction layer 242, the beam diameter $\varphi$ of the non-collimated light beam 25 when projected to the diffraction layer 242 is at least 1 mm. According to the above mathematical relationship (1), the working distance $W_d$ between the light source 220 and the diffraction layer 242 is at least one 1.37 mm.

After the type of the laser light source module 22 of the structured light generation device 2 is selected and the half angle of beam diffusion ($\theta$) of the non-collimated light beam 25 and the beam diameter $\varphi$ of the non-collimated light beam 25 are obtained, the working distance $W_d$ between the light source 220 and the diffraction layer 242. Consequently, the minimum volume of the structured light generation device 2 can be determined.

Figure 4:
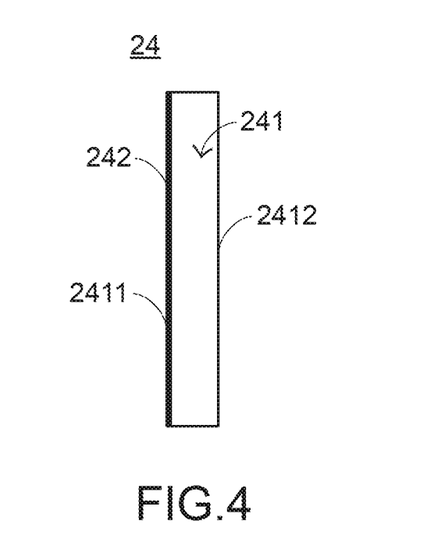
FIG. 4 is a schematic enlarged side view illustrating the diffractive optical element of the structured light generation device as shown in FIG. 3.

FIG. 4 is a schematic enlarged side view illustrating the diffractive optical element of the structured light generation device as shown in FIG. 3. A first surface 2411 of the light-transmissible substrate 241 faces the laser light source module 22. The optical information-bearing light 27 is outputted from a second surface 2412 of the light-transmissible substrate 241. The diffraction layer 242 is formed on the first surface 2411 of the light-transmissible substrate 241. The second surface 2412 of the light-transmissible substrate 241 is not equipped with the diffraction layer 242. In an embodiment, the diffraction layer 242 comprises plural microstructures that are formed on and exposed to the first surface 2411 of the light-transmissible substrate 241 through a UV curable adhesive layer. In another embodiment, the diffraction layer 242 comprises plural microstructures that are formed on an outer side of the first surface 2411 of the light-transmissible substrate 241 through a textured layer by an etching process. The first surface 2411 and the second surface 2412 of the light-transmissible substrate 241 are in parallel with each other. The thickness of the light-transmissible substrate 241 is about 0.3 mm. The way of forming the diffraction layer 242 and the type and thickness of the light-transmissible substrate 241 are not restricted.

Figure 5:
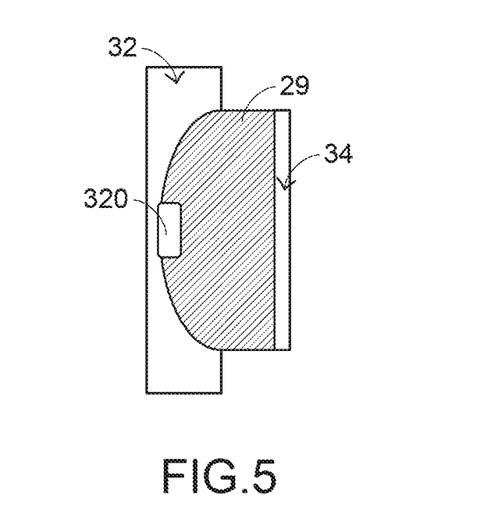
FIG. 5 is a schematic side view illustrating a portion of a structured light generation device according to a second embodiment of the present invention.

FIG. 5 is a schematic side view illustrating a portion of a structured light generation device according to a second embodiment of the present invention. The structures of the components of the structured light generation device which are identical to those of the first embodiment are not redundantly described herein. In the first embodiment, there is no filling material between the light source 220 and the diffractive optical element 24 and air is a medium for travelling the non-collimated light beam 25. In this embodiment, a non-air medium 29 is filled between the light source 320 of the laser light source module 32 and the diffractive optical element 34. The non-collimated light beam from the light source 320 is transmitted through the non-air medium 29. Due to the non-air medium 29, the structured light generation device can be fixed easily and fabricated quickly. Preferably but not exclusively, the non-air medium 29 is made of a silicone resin, an epoxy resin or a polymer compound.

Figure 6:
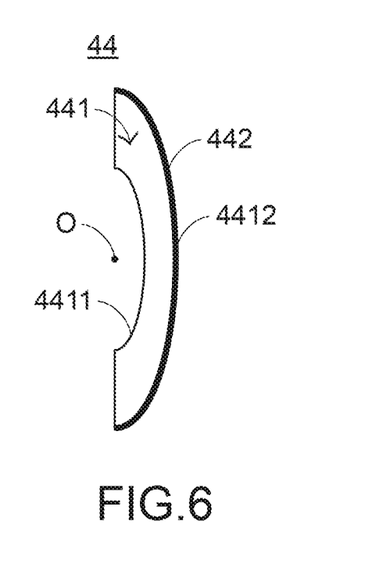
FIG. 6 is a schematic enlarged side view illustrating a diffractive optical element of a structured light generation device according to a third embodiment of the present invention.

FIG. 6 is a schematic enlarged side view illustrating a diffractive optical element of a structured light generation device according to a third embodiment of the present invention. The structures of the components of the structured light generation device which are identical to those of the first embodiment are not redundantly described herein. In this embodiment, the first surface 4411 of the light-transmissible substrate 441 facing the laser light source module does not have the diffracting function. The second surface 4412 of the light-transmissible substrate 441 is equipped with a diffraction layer 442 for receiving the non-collimated light beam and modulating the non-collimated light beam as the optical information-bearing light. In this embodiment, the first surface 4411 and the second surface 4412 of the light-transmissible substrate 441 are concentric surfaces. That is, the first surface 4411 and the second surface 4412 of the light-transmissible substrate 441 have the same center O. The drawing of FIG. 6 gives a reference of location for the center O is only for illustration. To be specific, the center location is more away from the DOE surface such that the cross section and hence, the dimension of width is smaller. This design has some benefits. After the non-collimated light beam is transmitted through the first surface 4411 of the light-transmissible substrate 441, the non-collimated light beam is directed to the second surface 4412 of the light-transmissible substrate 441 in a better incidence direction. Consequently, the diffractive optical element 44 has smaller diffraction error and the higher diffraction efficiency. In this embodiment, the diffractive optical element 44 has a proper numerical aperture (NA). Consequently, the first surface 4411 of the light-transmissible substrate 441 has sufficient collection power for the non-collimated light beam. Preferably but not exclusively, the numerical aperture (NA) of the diffractive optical element 44 is in the range between 0.1 and 0.64.

Figure 7:
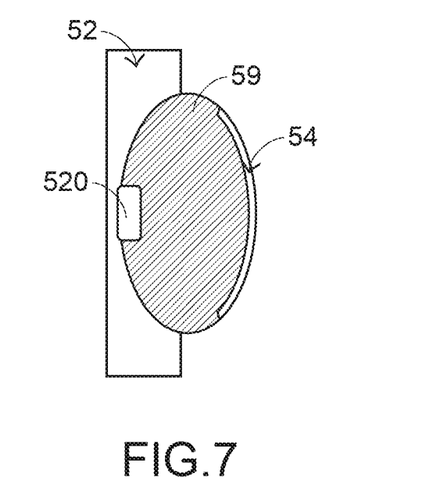
FIG. 7 is a schematic side view illustrating a portion of a structured light generation device according to a fourth embodiment of the present invention.

FIG. 7 is a schematic side view illustrating a portion of a structured light generation device according to a fourth embodiment of the present invention. The structures of the components of the structured light generation device which are identical to those of the third embodiment are not redundantly described herein. In the third embodiment, there is no filling material between the light source (not shown) and the diffractive optical element 44 and air is a medium for travelling the non-collimated light beam. In this embodiment, a non-air medium 59 is filled between the light source 520 of the laser light source module 52 and the diffractive optical element 54. The non-collimated light beam from the light source 520 is transmitted through the non-air medium 59. Due to the non-air medium 59, the structured light generation device can be fixed easily and fabricated quickly. Preferably but not exclusively, the non-air medium 59 is made of a silicone resin, an epoxy resin or a polymer compound.

In this embodiment, the diffractive optical element 54 has a proper numerical aperture (NA). Consequently, the diffractive optical element 54 has sufficient collection power for the non-collimated light beam. Preferably but not exclusively, the numerical aperture (NA) of the diffractive optical element 54 is in the range between 0.2 and 0.96.

Figure 8A:
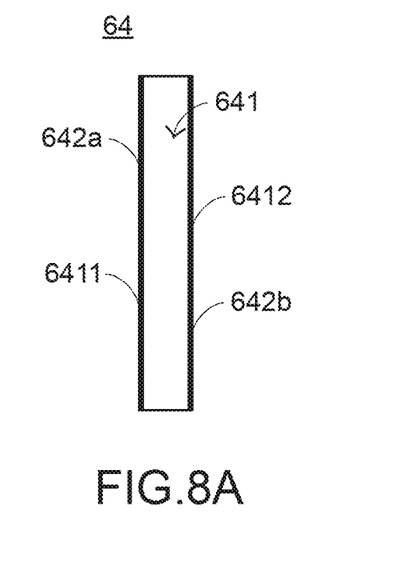
FIG. 8A is a schematic enlarged side view illustrating a diffractive optical element of a structured light generation device according to a fifth embodiment of the present invention.
Figure 8B:
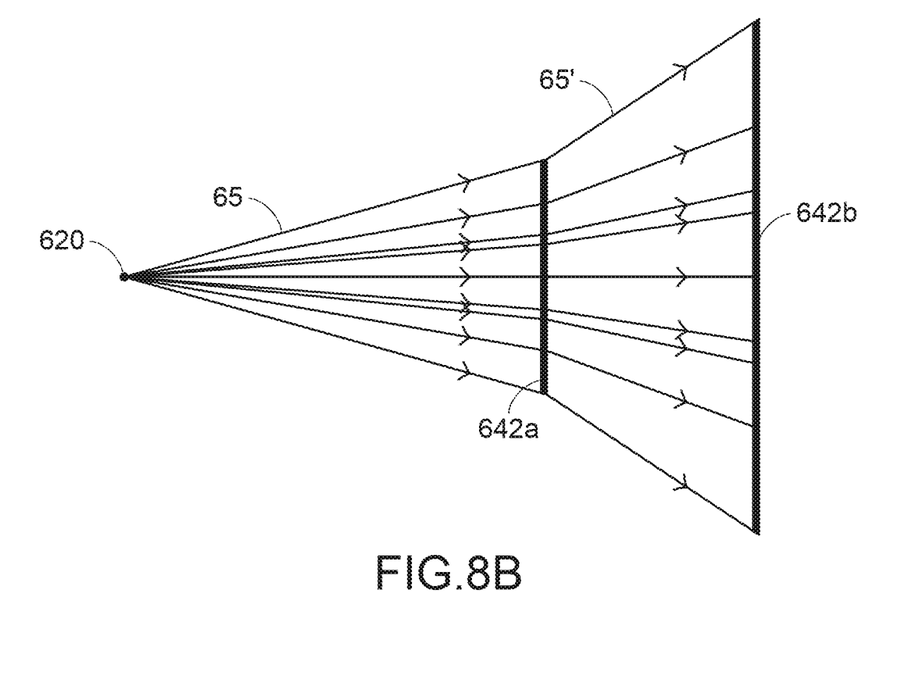
FIG. 8B schematically illustrates the optical path of the structured light generation device according to the fifth embodiment of the present invention.

Please refer to FIGS. 8A and 8B. FIG. 8A is a schematic enlarged side view illustrating a diffractive optical element of a structured light generation device according to a fifth embodiment of the present invention. FIG. 8B schematically illustrates the optical path of the structured light generation device according to the fifth embodiment of the present invention. The structures of the components of the structured light generation device which are identical to those of the first embodiment are not redundantly described herein. In this embodiment, a diffraction layer 642a is formed on the first surface 6411 of the light-transmissible substrate 641, and a diffraction layer 642b is formed on the second surface 6412 of the light-transmissible substrate 641. After the non-collimated light beam 65 from the light source 620 is transmitted through the diffraction layer 642a, the non-collimated light beam 65 is subjected to a beam-expanding action and thus a beam-expanded non-collimated light beam 65' is generated. In this embodiment, the laser wavelength is 850 nm and with a full beam diffusion angle 20 degrees. The corresponding object numerical aperture is 0.1 and effectively the f-number for the DOE is f/1.37. After the non-collimated light beam 65' is received by the diffraction layer 642b, the non-collimated light beam 65' is modulated as an optical information-bearing light. In this embodiment, the thickness of the light-transmissible substrate 641 is 1 mm. Preferably but not exclusively, the thicknesses of the diffraction layer 642a and the diffraction layer 642b are not larger than 0.3 mm. The functions of the diffraction layers 642a and 642b, the thicknesses of the diffraction layers 642a and 642b and the thickness of the light-transmissible substrate 641 may be varied according to the practical requirements.

The above examples are presented herein for purpose of illustration and description only. According to the practical requirements, the first surface or the second surface of the light-transmissible substrate of the diffractive optical element may be a flat surface or a curvy surface with a radian or a curvature. Moreover, the diffraction layer may be distributed over or formed on a part or an entire of the surface of the light-transmissible substrate. In the above embodiments, the diffraction layer is exposed outside the first surface or the second surface of the light-transmissible substrate. That is, the diffraction layer is located at an outer side of the first surface or second surface of the light-transmissible substrate. In some other embodiments, the diffraction layer is located at an inner side of the first surface or second surface of the light-transmissible substrate.

Figure 9A:
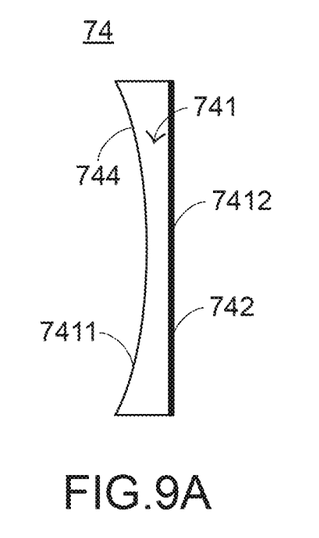
FIG. 9A is a schematic enlarged side view illustrating a diffractive optical element of a structured light generation device according to a sixth embodiment of the present invention.
Figure 9B:
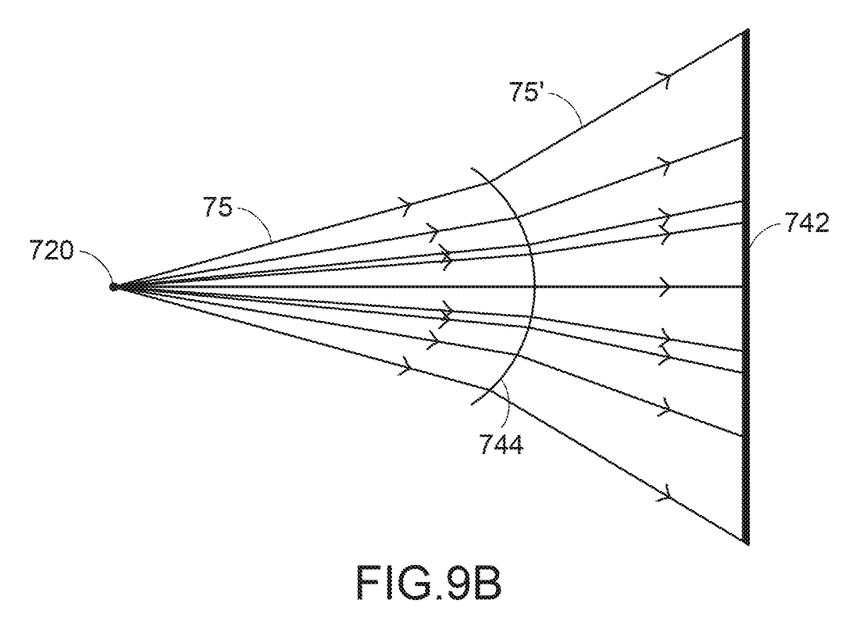
FIG. 9B schematically illustrates the optical path of the structured light generation device according to the sixth embodiment of the present invention.

In addition to the above structure, the diffractive optical element of the present invention may have a functional surface for providing another function. Please refer to FIGS. 9A and 9B. FIG. 9A is a schematic enlarged side view illustrating a diffractive optical element of a structured light generation device according to a sixth embodiment of the present invention. FIG. 9B schematically illustrates the optical path of the structured light generation device according to the sixth embodiment of the present invention. In the embodiment, the lasing wavelength is 850 nm and the full beam diffusion angle is 20 degrees. The structures of the components of the structured light generation device which are identical to those of the first embodiment are not redundantly described herein. In comparison with the first embodiment, the first surface 7411 of the light-transmissible substrate 741 of the diffractive optical element 74 facing the light source 720 has or comprises a beam-expandable structure or shape 744. For example, the beam-expandable structure or shape 744 is a concave lens structure. Here the concave lens structure is with a radius of curvature is about −0.6596 mm. In this embodiment, the corresponding object numerical aperture is 0.1 and effectively the corresponding (working) f-umber is about f/1.44.

The concave lens structure has a geometric optical surface produced by a DOE semiconductor production process or a precise machining process. The second surface 7412 of the light-transmissible substrate 741 is equipped with the diffraction layer 742. After the non-collimated light beam 75 is transmitted through the first surface 7411 of the light-transmissible substrate 741, the size of the non-collimated light beam is expanded. Since the light beam 75' to be projected to the diffraction layer 742 has a larger light-receiving area to acquire more wavefront modulation data, the projected image is more exquisite. It is noted that the beam-expandable structure or shape may be distributed over or formed on a part or an entire of the surface of the light-transmissible substrate. In this embodiment, the thickness of the light-transmissible substrate 741 is 1 mm. Preferably but not exclusively, the central thickness of the light-transmissible substrate 741 is not larger than 0.3 mm.

Figure 10:
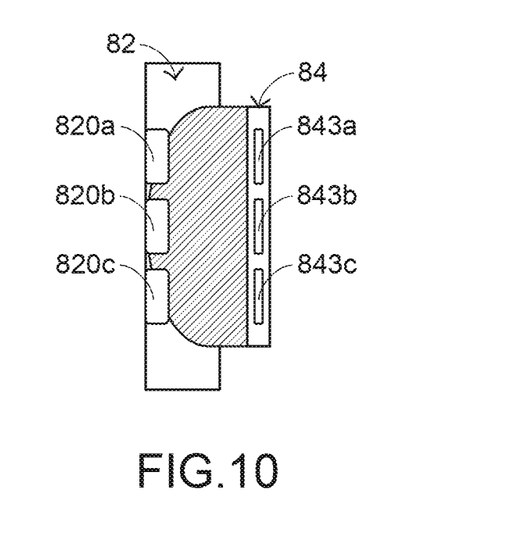
FIG. 10 is a schematic side view illustrating a portion of a structured light generation device according to a seventh embodiment of the present invention.
Figure 11A:
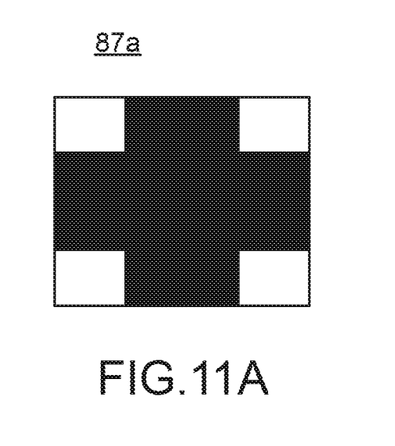
FIG. 11A schematically illustrates a first optical information-bearing light which is generated after the non-collimated light beam from the first light source of the structured light generation device of FIG. 10 is transmitted through the diffractive optical element.
Figure 11B:
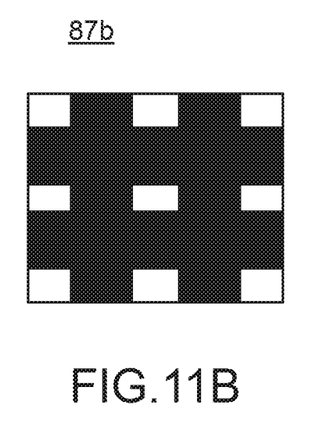
FIG. 11B schematically illustrates a second optical information-bearing light which is generated after the non-collimated light beam from the second light source of the structured light generation device of FIG. 10 is transmitted through the diffractive optical element.
Figure 11C:
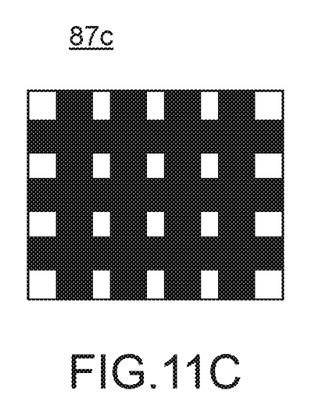
FIG. 11C schematically illustrates a third optical information-bearing light which is generated after the non-collimated light beam from the third light source of the structured light generation device of FIG. 10 is transmitted through the diffractive optical element.

Please refer to FIGS. 10, 11A, 11B and 11C. FIG. 10 is a schematic side view illustrating a portion of a structured light generation device according to a seventh embodiment of the present invention. FIG. 11A schematically illustrates a first optical information-bearing light which is generated after the non-collimated light beam from the first light source of the structured light generation device of FIG. 10 is transmitted through the diffractive optical element. FIG. 11B schematically illustrates a second optical information-bearing light which is generated after the non-collimated light beam from the second light source of the structured light generation device of FIG. 10 is transmitted through the diffractive optical element. FIG. 11C schematically illustrates a third optical information-bearing light which is generated after the non-collimated light beam from the third light source of the structured light generation device of FIG. 10 is transmitted through the diffractive optical element.

The structures of the components of the structured light generation device which are identical to those of the above embodiments are not redundantly described herein. In comparison with the above embodiments, the laser light source module 82 of the structured light generation device of this embodiment comprises a first light source 820a, a second light source 820b and a third light source 820c. The diffractive optical element 84 comprises a first modulation unit 843a, a second modulation unit 843b and a third modulation unit 843c corresponding to the first light source 820a, the second light source 820b and the third light source 820c, respectively. After the non-collimated light beam from the first light source 820a is transmitted through the first modulation unit 843a of the diffractive optical element 84, a first optical information-bearing light is generated. The structured light pattern 87a of the first optical information-bearing light is shown in FIG. 11A. After the non-collimated light beam from the second light source 820b is transmitted through the second modulation unit 843b of the diffractive optical element 84, a second optical information-bearing light is generated. The structured light pattern 87b of the second optical information-bearing light is shown in FIG. 11B. After the non-collimated light beam from the third light source 820c is transmitted through the third modulation unit 843c of the diffractive optical element 84, a third optical information-bearing light is generated. The structured light pattern 87c of the third optical information-bearing light is shown in FIG. 11C. Preferably but not exclusively, the non-collimated light beams are outputted from the first light source 820a, the second light source 820b and the third light source 820c in different time sequences. Under this circumstance, the structured light patterns 87a, 87b and 87c are shown according to different time sequences. According to the time sequences of outputting the non-collimated light beams from the first light source 820a, the second light source 820b and the third light source 820c, any two of the structured light patterns 87a, 87b and 87c are individually shown or overlapped with each other.

Figure 12:
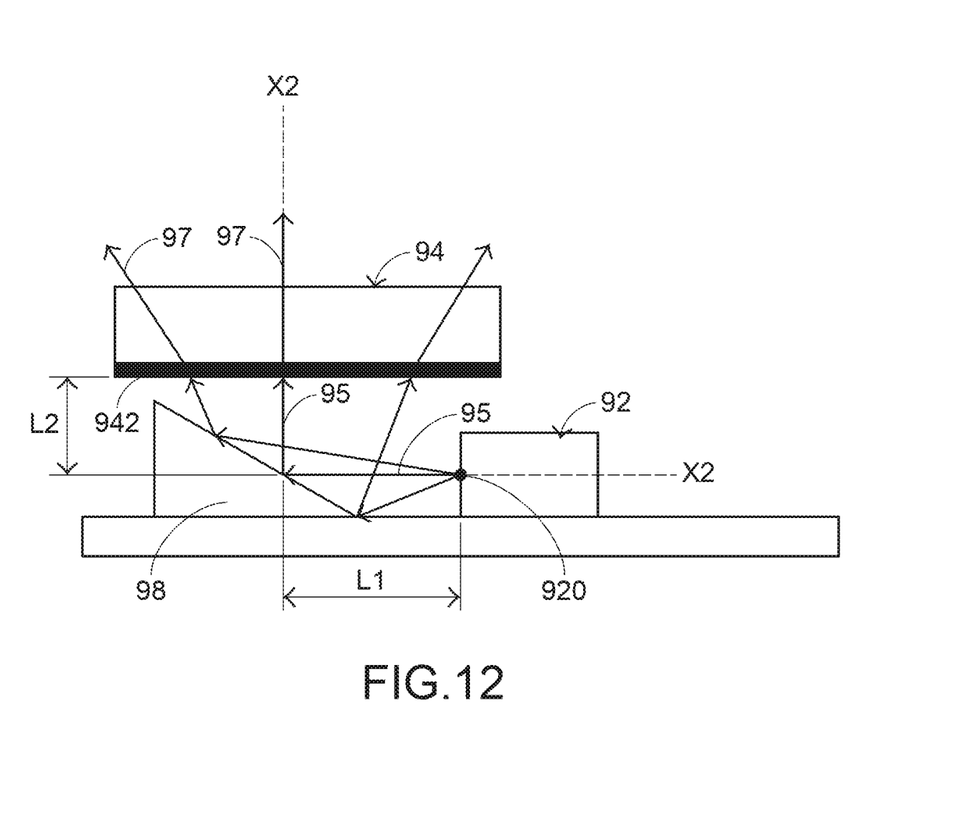
FIG. 12 is a schematic side view illustrating a structured light generation device according to an eighth embodiment of the present invention.

FIG. 12 is a schematic side view illustrating a structured light generation device according to an eighth embodiment of the present invention. The structures of the components of the structured light generation device which are identical to those of the above embodiments are not redundantly described herein. In this embodiment, the optical axis X2 corresponding to the light source 920 of the laser light source module 92 and the diffractive optical element 94 is non-linear. The structured light generation device of this embodiment further comprises a reflective mirror 98. The reflective mirror 98 is arranged between the laser light source module 92 and the diffractive optical element 94. After the non-collimated light beam 95 from the light source 920 is projected to the reflective mirror 98, the non-collimated light beam 95 is reflected to the diffractive optical element 94. The reflected non-collimated light beam 95' is received by the diffraction layer 942 of the diffractive optical element 94 and modulated as an optical information-bearing light 97. The distance between the light source 920 and the reflective mirror 98 along the optical axis X2 is L1. The distance between the reflective mirror 98 and the diffractive optical element 94 along the optical axis X2 is L2. Preferably but not exclusively, the total distance of the distance L1 and the distance L2 is in the range between 0 mm and 7 mm.

From the above descriptions, the present invention provides a structured light generation device. In comparison with the conventional technology, the structured light generation device of the present invention is not equipped with the collimator between the laser light source module and the diffractive optical element. More especially, if the diffractive optical element is attached on the laser light source module, the total length of the structured light generation device of the present invention along the optical axis can be largely reduced. Under this circumstance, the material cost and the assembling cost of the overall structured light generation device are both reduced. Consequently, the structured light generation device is suitably applied to a slim-type mobile device or a wearable device.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A structured light generation device, comprising:
   a laser light source module comprising a light source, wherein the light source emits a non-collimated light beam;
   a diffractive optical element comprising a diffraction layer, wherein after the non-collimated light beam from the laser light source module is received by the diffraction layer, the non-collimated light beam is modulated as an optical information-bearing light; and
   a non-air medium filled between the light source and the diffractive optical element, wherein the non-collimated light beam is transmitted through the non-air medium,
   wherein the structured light generation device satisfies at least one of mathematical relationships (1) and (2):

$$W_d \geq \frac{\varphi}{2 \cdot \tan\theta}, \quad (1)$$

$$1 \text{ mm} < W_d < 7 \text{ mm} \quad (2)$$

wherein θ is a half angle of beam diffusion of the non-collimated light beam, φ is a beam diameter of the non-collimated light beam when projected to the diffraction layer, and $W_d$ is a working distance between the light source and the diffraction layer.

2. The structured light generation device according to claim 1, wherein the optical information-bearing light is a coded structured light.

3. The structured light generation device according to claim 1, further comprising a casing, wherein the laser light source module, the diffractive optical element and the non-air medium are accommodated within the casing, and the optical information-bearing light is outputted from the structured light generation device through at least one light output zone of the casing.

4. The structured light generation device according to claim 1, wherein the diffractive optical element further comprises a light-transmissible substrate, and the diffraction layer is disposed on a first surface of the light-transmissible substrate.

5. The structured light generation device according to claim 4, wherein the diffraction layer comprises plural microstructures.

6. The structured light generation device according to claim 4, wherein the first surface and a second surface of the light-transmissible substrate are concentric surfaces, wherein the first surface of the light-transmissible substrate is arranged between the laser light source module and the second surface of the light-transmissible substrate, or the second surface of the light-transmissible substrate is arranged between the laser light source module and the first surface of the light-transmissible substrate.

7. The structured light generation device according to claim 4, wherein the first surface of the light-transmissible substrate is a flat surface or a curvy surface.

8. The structured light generation device according to claim 4, wherein the diffraction layer is distributed over a part or an entire of the first surface of the light-transmissible substrate.

9. The structured light generation device according to claim 4, wherein the diffraction layer is located at an outer side of the first surface of the light-transmissible substrate and exposed outside the first surface of the light-transmissible substrate, or the diffraction layer is located at an inner side of the first surface of the light-transmissible substrate.

10. The structured light generation device according to claim 4, wherein the first surface of the light-transmissible substrate faces the laser light source module or faces an external side of the structured light generation device.

11. The structured light generation device according to claim 4, wherein the diffractive optical element further comprises a beam-expandable functional structure, wherein the beam-expandable functional structure is formed on or disposed on a second surface of the light-transmissible substrate, and the non-collimated light beam is transmitted through the beam-expandable functional structure.

12. The structured light generation device according to claim 11, wherein the beam-expandable functional structure comprises a concave lens structure with a geometric optical surface, wherein the concave lens structure is produced by a semiconductor production process or a precise machining process.

13. The structured light generation device according to claim 11, wherein the first surface of the light-transmissible substrate is arranged between the laser light source module and the second surface of the light-transmissible substrate, or the second surface of the light-transmissible substrate is arranged between the laser light source module and the first surface of the light-transmissible substrate.

14. The structured light generation device according to claim 4, wherein the diffractive optical element further comprises an additional diffraction layer, wherein the additional diffraction layer is disposed on a second surface of the light-transmissible substrate, and the second surface of the light-transmissible substrate is arranged between the laser light source module and the first surface of the light-transmissible substrate, wherein after the non-collimated light beam from the light source is transmitted through the additional diffraction layer, the non-collimated light beam is subjected to a beam-expanding action, wherein the beam-expanded non-collimated light beam is modulated as the optical information-bearing light by the diffraction layer on the first surface of the light-transmissible substrate.

15. The structured light generation device according to claim 4, wherein a thickness of the light-transmissible substrate is smaller than 1.0 mm.

16. The structured light generation device according to claim 1, wherein there is a spacing distance between the laser light source module and the light-transmissible substrate, and the spacing distance is in a range between 0 mm and 4 mm.

17. The structured light generation device according to claim 1, wherein a numerical aperture (NA) of the diffractive optical element is in a range between 0.1 and 0.64.

18. The structured light generation device according to claim 1, wherein the non-air medium is made of a silicone resin, an epoxy resin or a polymer compound.

19. The structured light generation device according to claim 18, wherein a numerical aperture (NA) of the diffractive optical element is in a range between 0.2 and 0.96.

20. The structured light generation device according to claim 1, wherein a thickness of the diffraction layer is smaller than 0.1 mm.

21. The structured light generation device according to claim 1, wherein the laser light source module outputs a dot-like light pattern, a stripe-like light pattern, a multi-stripe light pattern, a randomly-distributed dot array light pattern or a regularly-distributed dot array light pattern.

22. The structured light generation device according to claim 1, wherein the laser light source module further comprises an additional light source, and the diffractive optical element comprises a first modulation unit corresponding to the light source and a second modulation unit corresponding to the additional light source, wherein after the non-collimated light beam from the light source is transmitted through the first modulation unit, the optical information-bearing light is generated, wherein after an additional non-collimated light beam from the additional light source is transmitted through the second modulation unit, an additional optical information-bearing light is generated.

23. The structured light generation device according to claim 22, wherein the non-collimated light beam from the light source and the additional non-collimated light beam from the additional light source are outputted according to different time sequences, or the non-collimated light beam from the light source and the additional non-collimated light beam from the additional light source are outputted according to the same time sequence.

24. A diffractive optical element, comprising:
a light-transmissible substrate; and
a diffraction layer disposed on the light-transmissible substrate, wherein after a non-collimated light beam from a light source is received by the diffraction layer, the non-collimated light beam is modulated as an optical information-bearing light, wherein the diffractive optical element satisfies at least one of mathematical relationships (1) and (2):

$$W_d \geq \frac{\varphi}{2 \cdot \tan\theta}, \quad (1)$$

$$1 \text{ mm} < W_d < 7 \text{ mm} \quad (2)$$

wherein $\theta$ is a half angle of beam diffusion of the non-collimated light beam, $\varphi$ is a beam diameter of the non-collimated light beam when projected to the diffraction layer, and $W_d$ is a working distance between the light source and the diffraction layer,
wherein a non-air medium is filled between the light source and the diffractive optical element, wherein the non-collimated light beam is transmitted through the non-air medium.

25. The diffractive optical element according to claim 24, wherein the diffraction layer is disposed on a first surface of the light-transmissible substrate.

26. The diffractive optical element according to claim 25, wherein the diffraction layer comprises plural microstructures.

27. The diffractive optical element according to claim 25, wherein the first surface and a second surface of the light-transmissible substrate are concentric surfaces, wherein the first surface of the light-transmissible substrate is arranged between the light source and the second surface of the light-transmissible substrate, or the second surface of the light-transmissible substrate is arranged between the light source and the first surface of the light-transmissible substrate.

28. The diffractive optical element according to claim 25, wherein the first surface of the light-transmissible substrate is a flat surface or a curvy surface.

29. The diffractive optical element according to claim 25, wherein the diffraction layer is distributed over a part or an entire of the first surface of the light-transmissible substrate.

30. The diffractive optical element according to claim 25, wherein the diffraction layer is located at an outer side of the first surface of the light-transmissible substrate and exposed outside the first surface of the light-transmissible substrate, or the diffraction layer is located at an inner side of the first surface of the light-transmissible substrate.

31. The diffractive optical element according to claim 25, wherein the diffractive optical element further comprises a beam-expandable functional structure, wherein the beam-expandable functional structure is disposed on a second surface of the light-transmissible substrate.

32. The diffractive optical element according to claim 31, wherein the beam-expandable functional structure comprises a concave lens structure, and the concave lens structure is distributed over a part or an entire of the second surface of the light-transmissible substrate.

33. The diffractive optical element according to claim 25, wherein the diffractive optical element further comprises an additional diffraction layer, wherein the additional diffraction layer is disposed on a second surface of the light-transmissible substrate, and the second surface of the light-transmissible substrate is arranged between the light source and the first surface of the light-transmissible substrate, wherein after the non-collimated light beam from the light source is transmitted through the additional diffraction layer, the non-collimated light beam is subjected to a beam-expanding action, wherein the beam-expanded non-collimated light beam is modulated as the optical information-bearing light by the diffraction layer on the first surface of the light-transmissible substrate.

34. The diffractive optical element according to claim 24, wherein a thickness of the light-transmissible substrate is smaller than 1.0 mm.

35. The diffractive optical element according to claim 24, wherein a thickness of the diffraction layer is smaller than 0.1 mm.

36. The diffractive optical element according to claim 24, wherein a numerical aperture (NA) of the diffractive optical element is in a range between 0.1 and 0.64.

37. The diffractive optical element according to claim 24, wherein the non-air medium is made of a silicone resin, an epoxy resin or a polymer compound.

38. The diffractive optical element according to claim 24, wherein a numerical aperture (NA) of the diffractive optical element is in a range between 0.2 and 0.96.

* * * * *